(12) United States Patent
Shen

(10) Patent No.: US 6,826,828 B1
(45) Date of Patent: Dec. 7, 2004

(54) ELECTROSTATIC DISCHARGE-FREE CONTAINER COMPRISING A CAVITY SURROUNDED BY SURFACES OF PMMA-POLY COVERED METAL-PMMA

(75) Inventor: Yun-Hung Shen, Hsin-Chu (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 287 days.

(21) Appl. No.: 09/933,961

(22) Filed: Aug. 22, 2001

(51) Int. Cl.⁷ .................................................. H05K 3/30
(52) U.S. Cl. ..................... 29/832; 29/830; 428/34.1; 174/35 R; 361/679; 361/816; 206/719
(58) Field of Search .................. 29/830, 832, 846; 428/34.1; 174/35 R, 35 GL; 361/679, 816; 206/719

(56) References Cited

U.S. PATENT DOCUMENTS

| 4,749,625 | A | * | 6/1988 | Obayashi et al. ........... 428/624 |
| 4,776,462 | A | | 10/1988 | Kosugi et al. .............. 206/334 |
| 5,469,963 | A | | 11/1995 | Bonora et al. .............. 206/709 |
| 5,999,397 | A | | 12/1999 | Chen et al. ................. 361/212 |
| 6,196,391 | B1 | | 3/2001 | Li .............................. 206/719 |
| 6,476,317 | B1 | * | 11/2002 | Frederickson et al. . 174/35 MS |
| 6,582,785 | B2 | * | 6/2003 | Nagata et al. ............. 428/34.1 |
| 6,624,432 | B1 | * | 9/2003 | Gabower et al. ........ 250/515.1 |

* cited by examiner

Primary Examiner—Richard Chang
(74) Attorney, Agent, or Firm—Thomas, Kayden, Horstemeyer & Risley

(57) ABSTRACT

A ESD-free container is provided. A compound material is used for the creation of the container, the compound material comprising a metallic material that is wedged between layer of polymide material. The compound material is surrounded by layers of PMMA, resulting in a container having a cavity that is surrounded by a first layer of PMMA, a second layer of the compound material and a third layer of PPMA.

9 Claims, 4 Drawing Sheets

ELECTROSTATIC DISCHARGE-FREE CONTAINER COMPRISING A CAVITY SURROUNDED BY SURFACES OF PMMA-POLY COVERED METAL-PMMA

BACKGROUND OF THE INVENTION (1) Field of the Invention

The invention relates to the fabrication of integrated circuit devices, and more particularly, to a method and apparatus for storing and transportation of components, such as reticles, that are used in semiconductor manufacturing.

(2) Description of the Prior Art

In the art of creating semiconductor devices, it is frequently required to transport these devices from one location in the semiconductor foundry to another location. The same is true for parts of processing tools, such a reticles, which may be required at more than one location. In view of the cost of the parts that are being transported, it is to be expected that extreme care must be taken during transportation, assuring that no damage is incurred by the transported components as a result of the transportation thereof.

Components that may need to be transported include the indicated reticles but can also comprise semiconductor (ceramic, glass, gallium arsenide, sapphire and silicon) substrates, surfaces containing epitaxial layers of silicon supported by a base semiconductor, printed circuit boards, flex circuits, metallized substrates, substrates used for flat panel displays and semiconductor device mounting support.

When transporting semiconductor components, one of the causes of concern is the occurrence of Electro Static Discharge (ESD) or static electricity, which readily develops on surfaces that contain insulating materials since the insulating materials inhibit the free flow of accumulated electrical charges to other, potentially less harmful locations. Any frictional contact or movement that occurs between components containing insulating materials is prone to result in the accumulation of electromagnetic charges. These electromagnetic charges will, at the time that these charges are brought in contact with a conductive path of low resistivity, discharge, potentially causing damage to the components on the surface of which the ESD has accumulated or injury to an individual through whom the discharge may take place.

Strict measures are typically taken to prevent the accumulation of electrical charges by methods of grounding production equipment, by controlling the humidity in the work environment thus preventing the accumulation of electrical charge or by facilitating discharge to ground surfaces by making these surface more conductive and therefore more likely to form a conduit for ongoing electrical discharge during operational activities. As a side benefit of these activities it is typically found that other negative factors in the manufacturing environment, such as the accumulation of dust, is also further controlled and reduced.

When however taking into account the size and the complexity of a typical semiconductor manufacturing facility, in addition to the large number of processing tools that are typically present in such a facility, it is to be expected that the occurrence of the accumulation of random electrical charges as yet remains a problem and that the complete elimination of such charges is an objective that as yet has to be met.

Since however it remains a requirement that semiconductor components, as listed above, must as yet be transported from location to location within a semiconductor foundry, it is good policy to assume that randomly accumulated electrical charges are present and that therefore the components that are being transported must be protected against potential damage from these charges during transportation. For this purpose a container is frequently used into which the component is posited during transportation.

To avoid the above highlighted problems, the container must be constructed such that no electrical charge can affect the component that is loaded into the container. Current containers consist of the body of the container that comprises a top lid, a bottom lid and four sidewalls that extend between the top lid and the bottom lid in a planar perpendicular construction. The top lid, bottom lid and sidewalls define the cavity of the container. The materials that are typically used for the creation of the elements of the container contain electrically insulating materials such as polymeric materials, for reasons that have been detailed above.

With this type of a construction it has however been found that, due to the uniform nature of the elements of the container when viewed in cross section of these elements, electrical charge may as yet accumulate on the elements of the container, charging one or more of the elements of the container and therefore as yet penetrating to the component that is contained inside the container.

It is therefore of value for the process of transporting semiconductor components in a semiconductor manufacturing environment to provide a container such that no electrical charge can penetrate to the component that is transported inside the container. The invention provides such a container by inserting a metallic coating between layers of polymeric materials, a stack of polymeric material and metallic coating is used to create the elements (such as a top lid, a bottom lid and sidewalls) of the container.

U.S. Pat. No. 6,196,391 (Li) and U.S. Pat No. 5,999,397 (Chen et al.) show containers for ESD protection of reticles.

U.S. Pat. No. 5,469,963 (Bonora et al.) is a related patent.

U.S. Pat. No. 4,776,462 (Ksugi et al.) shows a container for a reticle.

SUMMARY OF THE INVENTION

A principle objective of the invention is to provide a container that can be used to transport semiconductor components such that these components will not be affected by discharge of static electricity.

It is another objective of the invention is to provide a method and package for handling a photolithographic reticle.

Another objective of the invention is to provide a method and package that prevents the occurrence of ESD on a photolithographic reticle.

In accordance with the objectives of the invention, a new container is provided whereby an article that is stored inside the cavity of a container will not be affected by a discharge of static electricity. The article stored in the container is protected against electromagnetic charges that accumulate as a result of the triboelectricity mechanism and charges that are induced by an electromagnetic field. A compound material is used for the creation of the container, the compound material contains a metallic material that is wedged between layers of polyimide material. The layering of materials effectively shields the component that is loaded into the container against surrounding electromagnetic fields.

DESCRIPTION OF THE PREFERRED EMBODIMENTS

Figure 1:
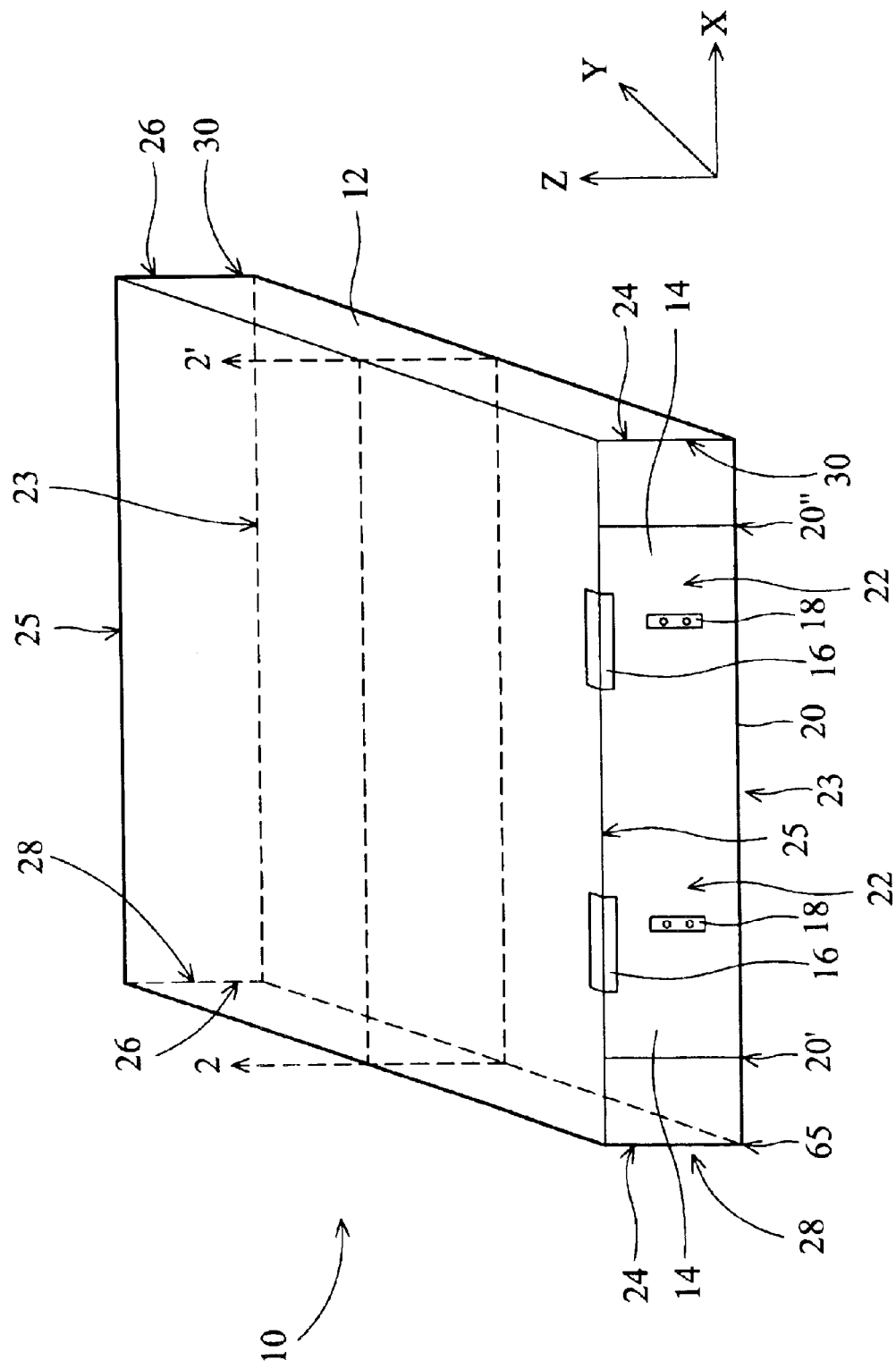
FIG. 1 shows a three dimensional view of the component container of the invention.

The current method and materials that are used for the creation of a container that is used to transport electrical components is first reviewed.

The material that is used for the conventional creation of a container is polymethylmethacrylate (PMMA). The disadvantage that is incurred using this material is that electric charges can accumulate on the container, charging the elements of the container and in this manner penetrating to a component that is positioned inside the container. Electric charges accumulate on insider surfaces of the container, coming in contact with the component that has been placed inside the container, exposing the component to an electromagnetic discharge (ESD).

The invention provides for creating a container using layers of material, an outer layer of PMMA is followed by a central layer of metal (such as aluminum) which is followed by an inner coating of PMMA. The construction of the container of the invention is shown three-dimensional view in FIG. 1 the highlights of which are as follows:

10, the component container of the invention 12, the main body of the component container 10 of the invention 14, the (front) access door of the component container 10 of the invention 16, a set of two hinges by which the front access door 14 of the component container 10 of the invention rotates and by means of which the front access door 14 of the component container 10 of the invention is attached to the main body 12 of the component container 10 of the invention 18, knobs or protrusions attached to the front of the access door 14 of the component container 10 of the invention, which motion limited by hinges 16

20, the lower edge or extremity of access door 14, stretching between point 20' and 20"

22, the upward and rotating motion of edge 20 during the opening of access door 14

24, the front surface of the component container 10 of the invention 26, the back surface of the component container 10 of the invention 28, the left side surface of the component container 10 of the invention when facing the access door 14 of the component container 10 of the invention 30, the right side surface of the component container 10 of the invention when facing the access door 14 of the component container 10 of the invention 23, the bottom surface of the component container 10 of the invention 25, the top surface of the component container 10 of the invention.

Above have been listed the main elements of the container 10 of the invention. In order to be able to better define the container of the invention, it is of value to state that the container 10 of the invention has three dimensions. These three dimensions are typically referred to as Cartesian X, Y and Z dimensions (see diagram as part of FIG. 1) that have all the properties of conventional Cartesian X, Y and Z coordinates such as intersecting under an angle of 90 degrees. These Cartesian coordinates of the container of the invention can be defined as intersecting at point 65, placing the container 10 of the invention above the X–Y plane in a Z-direction. Point 65 is the intersect between the front surface 24, the bottom surface 23 and the left side surface 28. Positive directions of the three axis along which the Cartesian coordinates are plotted are the directions that extend along the X-axis from point 65 to the right side surface 30 (the positive direction for the X coordinate), that extend along the Y-axis from point 65 to the back surface 26 (the positive direction for the Y coordinate) and that extend along the Z-axis from point 65 to the top surface 25 (the positive direction for the Z coordinate).

The thickness of the surfaces of the component container 10 of the invention, such as front surface 24 and back surface 26, has not, for reasons of simplicity, been indicated in the three dimensional view shown in FIG. 1.

Figure 2:
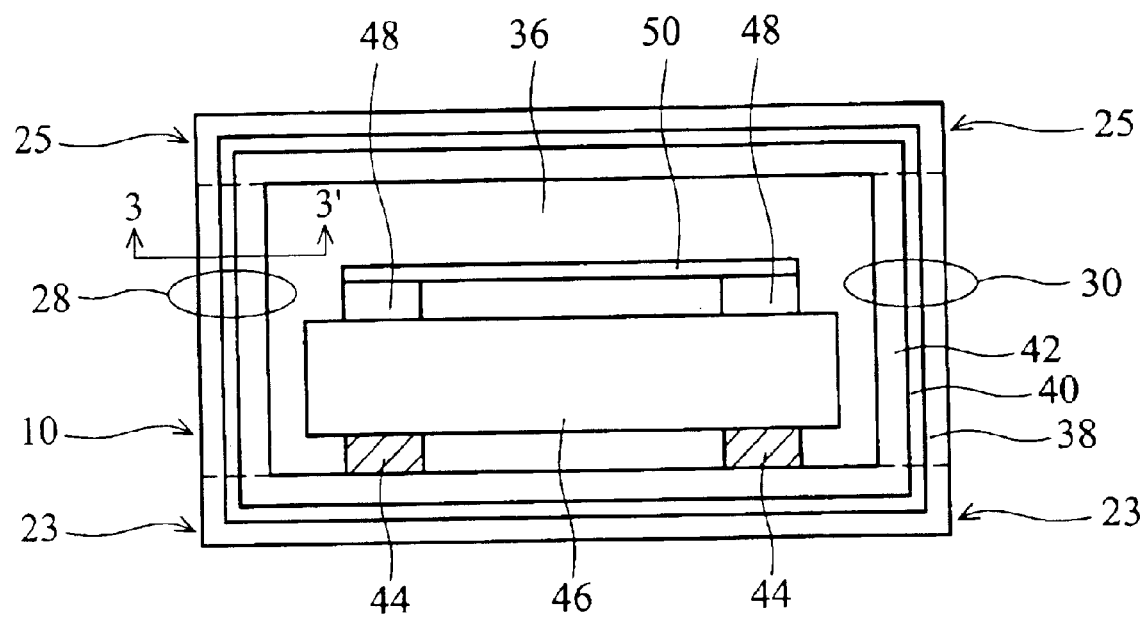
FIG. 2 shows a cross section of the component container of the invention.

FIG. 2 shows a cross section of the component container 10 of the invention, taken in a plane that is parallel with the front surface 24 and the back surface 26 of the container 10 of the invention. The exact location of the cross sectional plane is not important as long as this cross sectional plane does not intersect the front surface 24 or the back surface 26 of container 10 of the invention but is located between these two surfaces 24 and 26. Plane 2–2' has been highlighted as one of the planes that can be used for the cross section of FIG. 1 that is shown in FIG. 2.

23, the bottom surface of the component container of the invention 25, the top surface of the component container 10 of the invention 36, the cavity of the component container 10 of the invention; the components that are transported using the component container 10 of the invention are positioned inside cavity 36

38, the outer layer or shell of the surfaces of the component container 10 of the invention 40, a metallic coating that is embedded within the surfaces of the component container 10 of the invention 42, the inner layer or shell of the surfaces of the component container 10 of the invention 44, first supports which are provided underneath a component support unit 46

46, a plastic component support unit over which the components that are transported using the component container 10 of the invention are positioned during transportation 48, second supports which are provided on the surface of plastic support unit 46, and 50, the component, preferably a reticle, that has been positioned inside the component container 10 of the invention.

Figure 3:
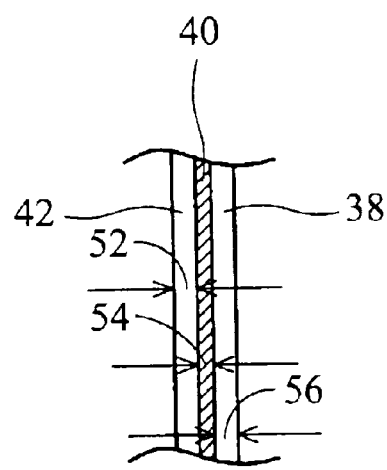
FIG. 3 shows a cross section of a side surface of the component container of the invention.

Further detail relating to the component container 10 of the invention is shown in FIG. 3, which is a cross section of a side surface of the component container 10 of the invention such as the cross section that is highlighted as cross section 3-3' in FIG. 2. The cross section that is shown in FIG. 3 is not drawn to scale. In an actual construction of the component container 10 of the invention the thickness 54 of layer 40 of metallic coating, preferably containing aluminum, is considerably less than the thicknesses 52 and 56 of respectively layers 42 and 38.

Figure 4:
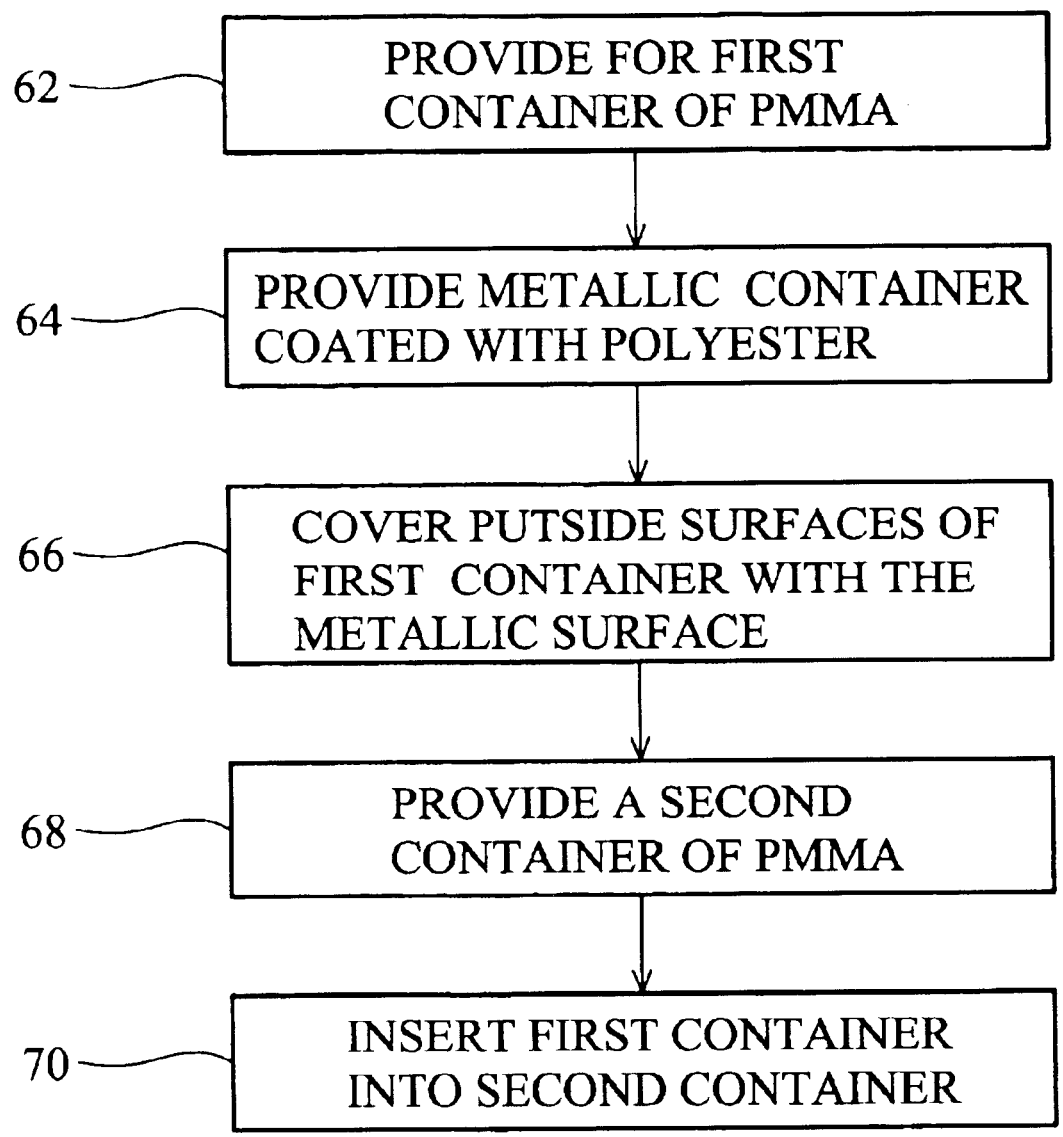
FIG. 4 shows flow diagram of the steps that are required to create the component container of the invention.
Figure 5:
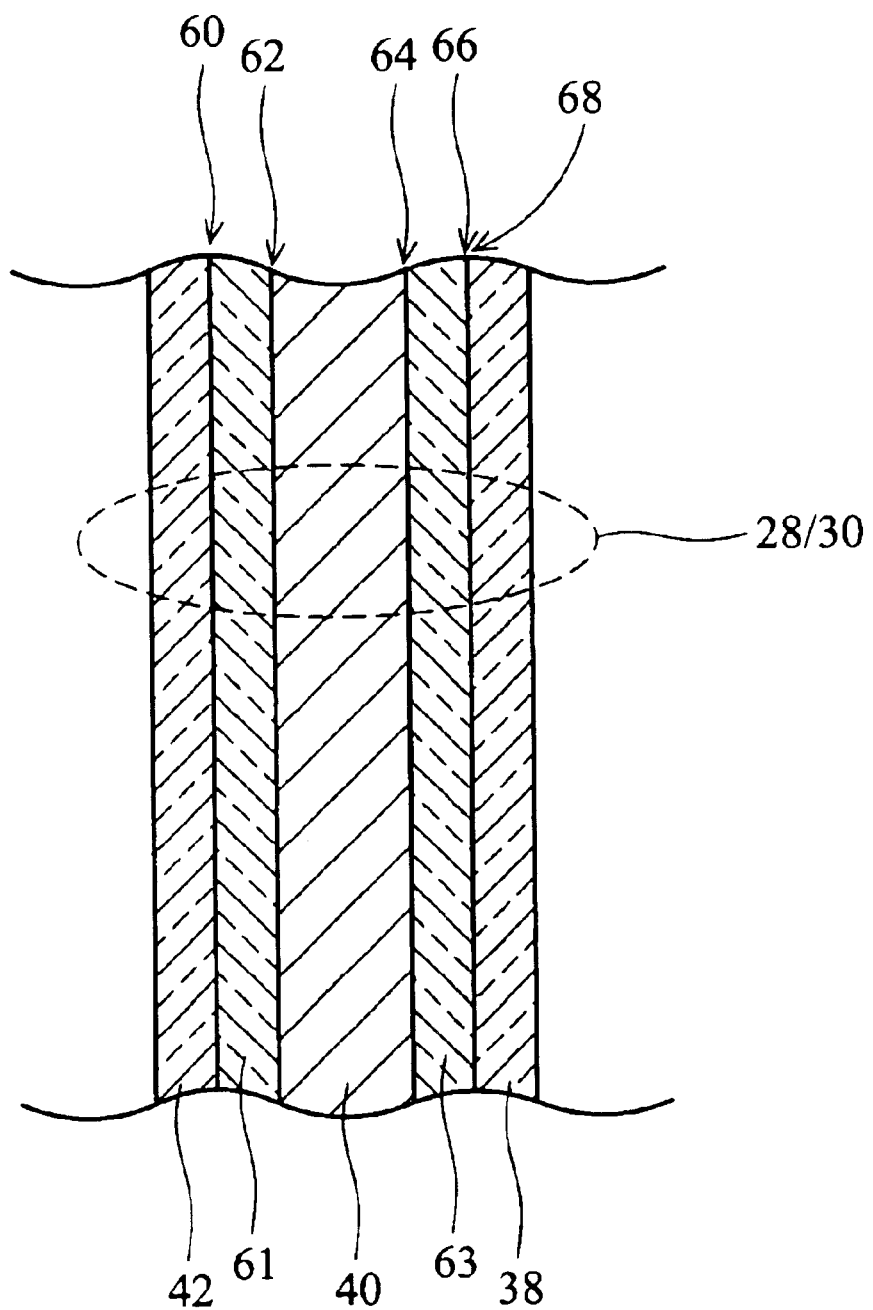
FIG. 5 shows additional detail relating to layers of material that are provided for the walls of the component container of the invention.

The preferred method for the construction of the component container 10 of the invention is highlighted in the flow diagram of FIG. 4, as follows:

1. start with a first container or box that is created using PMMA, this first container (having an outer surface) forms the inner shell 42 of the component container 10 of the invention, this first container is therefore provided with a (front) access door 14; step 62, FIG. 4; it is assumed that the cavity of the first container has been provided with support surfaces such as supports 44 and 48 and surface 46 that are required to position a component, such as a reticle, inside the cavity of the second container;
2. provide a metallic surface, preferably containing aluminum, and coat both surfaces of this metallic surface with a layer of polyester; step 64, FIG. 4
3. cover the outer surface of the first container with the polyester coated layer of metallic material, including the access door 14, creating a first container of PMMA that is surrounded by a (polyester covered) metallic layer; step 66, FIG. 4
4. provide a second container or box that is created using PMMA, this second container (having an inner and an outer surface) forms the outer shell 38 of the component container 10 of the invention, this second container is therefore provided with a (front) access door 14; step 68, FIG. 4, and
5. insert the first container (surrounded by the polyester covered metallic layer) inside the second container of PMMA; step 70, FIG. 4.

The invention can be summarized as follows, in this summarization a close relationship is established between the cross sections of FIGS. 1–3 of the invention and the claims of the invention, as follows:

the invention provides a method of creating a component container 10, shown in three dimensional view in FIG. 1 and in cross section in FIG. 2, for storing and transporting components, such as component 50 shown in FIG. 2, that are used for the manufacturing of semiconductor devices (not highlighted), comprising providing an inner shell 42, FIGS. 2 and 5, the inner shell comprising polymethylmethacrylate (PMMA), the inner shell having an outer surface 60, FIG. 5, the inner shell 42 having been provided with a cavity 36, FIG. 2, the inner shell 42 having been provided with a front surface 24, FIG. 1, the front surface 24, FIG. 1, having been provided with a means 14, FIG. 1, for accessing the cavity 36, FIG. 2, of the inner shell 42, the cavity 36, FIG. 2, having been provided with a means 44/46/48, FIG. 2, for positioning the component 50, FIG. 2 inside the cavity 36, FIG. 2.

providing a metallic layer 40, FIGS. 3 and 5, having a first (62, FIG. 5) and a second (64, FIG. 5) surface, the first (62, FIG. 5) and the second (64, FIG. 5) surface having been coated with a layer of polyimide, that is layer 61 of poly having been coating over first surface 62 of layer 40, FIG. 5, and layer 63 of poly having been coated over second surface 64 of layer 40, FIG. 5 attaching the metallic layer 40 to the outer surface 60, FIG. 5, of the inner shell, completely covering the inner shell 42 with the metallic layer 40, creating a two layered shell having a cavity 36, FIG. 2, the two layered (42/40) shell further having outside surfaces 66, FIG. 5, the outside surfaces of the two layered shell 42/40 having first dimensions in an X, Y and Z direction providing an outer shell 38, FIGS. 2 and 5, the outer shell comprising polymethylmethacrylate (PMMA), the outer shell 38 having a cavity (36, FIG. 2), the outer shell 38 having been provided with a front surface 24, FIG. 1, the front surface 24 having been provided with a means 14, FIG. 1, for accessing the cavity 36 of the outer shell 38 further having inside surfaces 68, FIG. 5, the inside surface 68 of the outer shell 38 having second dimensions in an X, Y and Z direction, the second dimensions of the outer shell 38 being essentially equal to the first dimension of the two layered shell 42/40, thereby completely surrounding the two layered shell 42/40 with the outer shell 38 the providing the means for positioning the component inside the cavity comprising:
(i) providing at least one support post 44, FIG. 2, having a surface in a plane (not highlighted), the at least one support post 44 comprising a high-resistivity material
(ii) providing at least one platform 46, FIG. 2, and
(iii) positioning the at least one platform 46, FIG. 2, above the at least one support post 44, FIG. 2, the at least one platform 46 being in contact with the at least one support post 44, the at least one platform 46 being positioned in the plane of the surface of the at least one support post 44, the at least one support post 44 comprising a high-resistivity material.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating an electrostatic discharge free component container for storing and transporting components that are used for manufacturing of semiconductor devices, comprising:

providing an inner shell, said inner shell comprising polymethylmethacrylate (PMMA), said inner shell having an outer surface, said inner shell having been provided with a cavity, said inner shell having been provided with a front surface, said front surface having been provided with a means for accessing said cavity of said inner shell, said cavity having been provided with a means for positioning said component inside said cavity;

providing a metallic layer having a first and a second surface, said first and said second surface having been coated with a layer of polyimide;

attaching said metallic layer to said outer surface of said inner shell, completely covering said inner shell with said metallic layer, creating a two layered shell having a cavity, said two layered shell further having outside surfaces, said outside surfaces of said two layered shell having first dimensions in an X, Y and Z direction; and providing an outer shell, said outer shell comprising polymethylmethacrylate (PMMA), said outer shell having a cavity, said outer shell having been provided with a front surface, said front surface having been provided with a means for accessing said cavity of said outer shell, said outer shell further having inside surfaces, said inside surfaces of said outer shell having second dimensions in an X, Y and Z direction, said second dimensions of said out shell being essentially equal to said first dimensions of said two layered shell, thereby completely surrounding said two layered shell with said outer shell, thereby completing creation of an electrostatic discharge free container comprising a cavity that is surrounded by a compound layer of PMMA-Poly covered metal-PMMA, wherein said compound layer of PMMA-Poly covered metal-PMMA prevents both triboelectric charges and induction charges accumulated on said component.

2. The method of claim 1, said metallic layer comprising aluminum.

3. The method of claim 1, said providing said means for positioning said component inside said cavity, comprising:

providing at least one support post having a surface in a plane, said at least one support post comprising a high-resistivity material;

providing at least one platform; and positioning said at least one platform above said at least one support post, said at least one platform in contact with said at least one support post, said at least one support post comprising a high-resistivity material.

4. A method for creating an electrostatic discharge free component container for storing and transporting components that are used for manufacturing of semiconductor devices, comprising:

creating surfaces for said component container, said surfaces comprising at least two layers of high resistivity material, at least one layer of low resistivity material having been interspersed between said at least two layers of high resistivity material;

creating a cavity surrounded by said surfaces;

providing said cavity with a means for positioning said component inside said cavity; and providing at least one of said surfaces of said component container with means for accessing said cavity;

wherein said surfaces prevent both triboelectric charges and induction charges accumulated on said component.

5. The method of claim 4, said high resistivity material comprising polymethylmethacrylate (PMMA).

6. The method of claim 4, said low resistivity material comprising metal.

7. The method of claim 4, said low resistivity material comprising aluminum.

8. The method of claim 4, surfaces of said low resistivity material additionally being coated with polyester.

9. The method of claim 4, said providing said cavity with a means for positioning said component inside said cavity comprises:

providing at least one support post having a surface in a plane, said at least one support post comprising a high resistivity material;

providing at least one platform; and positioning said at least one platform above said at least one support, said at least one platform being contact with said at least one support post, said at least one platform being positioned in said plane of said surface of said at least one support post, said at least one support post comprising a high-resistivity material.

* * * * *